United States Patent [19]

Livesay

[11] Patent Number: 5,003,178

[45] Date of Patent: Mar. 26, 1991

[54] LARGE-AREA UNIFORM ELECTRON SOURCE

[75] Inventor: William R. Livesay, San Diego, Calif.

[73] Assignee: Electron Vision Corporation, San Diego, Calif.

[21] Appl. No.: 270,751

[22] Filed: Nov. 14, 1988

[51] Int. Cl.⁵ ............................................. H01J 7/24
[52] U.S. Cl. .......................... 250/492.300; 250/492.2; 250/423 F; 250/427; 313/362.1; 315/111.31; 315/111.81
[58] Field of Search ............. 250/492.3, 492.2, 492.21, 250/398, 423 R, 423 F, 426, 427, 424; 313/360.1, 362.1, 363.1, 231.31; 315/111.81, 111.31

[56] References Cited

U.S. PATENT DOCUMENTS

| | | | |
|---|---|---|---|
| 3,013,154 | 12/1961 | Triump | 250/492.3 |
| 3,515,663 | 6/1970 | Bodway | 204/192.17 |
| 3,831,052 | 8/1974 | Knechtli | 313/187 |
| 3,924,136 | 12/1975 | Heywick et al. | 250/492.21 |
| 3,970,892 | 7/1976 | Wakalopulos | 315/111.3 |
| 4,025,818 | 5/1977 | Giguere et al. | 315/337 |
| 4,087,698 | 5/1978 | Lee et al. | 250/492.3 |
| 4,119,688 | 10/1978 | Hiraoka | 250/492.2 |
| 4,194,123 | 3/1980 | Wittry | 250/398 |
| 4,220,545 | 9/1980 | Franzen et al. | 250/427 |
| 4,279,216 | 7/1981 | Buhl et al. | 118/723 |
| 4,492,873 | 1/1985 | Dmitriev et al. | 250/492.3 |
| 4,527,044 | 6/1985 | Bruel et al. | 250/492.3 |
| 4,539,217 | 9/1985 | Farley | 250/492.21 |
| 4,570,106 | 2/1986 | Sohval et al. | 313/363.1 |
| 4,645,978 | 2/1987 | Harvey et al. | 315/111.81 |
| 4,677,295 | 6/1987 | Negra et al. | 250/423 P |
| 4,694,222 | 9/1987 | Wakalopulos | 315/111.21 |
| 4,710,283 | 12/1987 | Singh et al. | 250/423 R |
| 4,713,585 | 12/1987 | Ohno et al. | 250/423 R |
| 4,721,885 | 1/1988 | Brodie | 313/574 |
| 4,737,688 | 4/1988 | Collins et al. | 313/362.1 |
| 4,742,232 | 5/1988 | Biddle et al. | 250/423 R |
| 4,749,911 | 6/1988 | Wakalopulos | 315/111.21 |
| 4,755,722 | 7/1988 | Wakalopulos | 315/111.31 |
| 4,767,931 | 8/1988 | Lato et al. | 250/423 R |
| 4,786,844 | 11/1988 | Farrell et al. | 315/111.21 |

FOREIGN PATENT DOCUMENTS

| 12059 | 1/1987 | Japan . |
| 163253 | 7/1987 | Japan . |
| 163254 | 7/1987 | Japan . |

OTHER PUBLICATIONS

Warren J. Ramler, "Performance Characteristics of a WIP Electron Beam System", presented at RadTech'88-North America Conf., Apr. 24-28, 1988.

Primary Examiner—Jack I. Berman
Assistant Examiner—Kiet T. Nguyen
Attorney, Agent, or Firm—Noel F. Heal

[57] ABSTRACT

A large-area electron source which can operate continuously, stably, and indefinitely in a poor vacuum environment. The source includes a glow discharge cathode, appropriately positioned with respect to a target anode, and a fine-mesh grid spaced from the cathode by a distance less than the mean free path length of electrons leaving the cathode, the grid being electrically biased to control the electron beam current over a wide range with only small grid voltage changes. An accelerating voltage applied to the cathode can be varied continuously from as low as a few hundred volts to 30 KeV or greater and the source will continue to operate satisfactorily. Further, the grid is made of a fine mesh wire of sufficiently small dimensions as to not be resolvable in the target plane. A further refinement of the device utilizes scanning coils to achieve additional uniformity of the incident beam at the target plane. The basic apparatus of the invention can be combined with other features, for use in shadow mask lithography, resist sensitivity measurement, lift off processing, and resist curing.

20 Claims, 3 Drawing Sheets

LARGE-AREA UNIFORM ELECTRON SOURCE

BACKGROUND OF THE INVENTION

This invention relates generally to electron exposure systems utilized to expose, treat and process coatings and materials. More specifically, the invention relates to a cold cathode gas discharge electron source having a broad uniform emitting area.

A requirement exists for a large-area electron beam source which is controllable, uniform, insensitive to poor vacuum and is long lived. There have been many processes developed in treating materials and in semiconductor device processing requiring electron beam broad area exposure. Many of these processes require an electron beam source which can be controlled in voltage and current, and can withstand the outgassing of the material being irradiated. Electron beam sources used to treat large volumes of materials have typically been isolated by means of a vacuum window to protect the electron emissive cathode from outgassing from the material being treated. Due to the difficulty of making large-area electron permeable vacuum windows, these systems have utilized a small scanning beam which is then raster scanned to uniformly expose larger areas. To achieve higher throughput processing it is advantageous to use a large-area or flood beam electron source, to expose the whole substrate simultaneously. However, without a vacuum window, these larger electron sources must be impervious to the outgassing of the materials being treated.

Many large-area thermionic cathodes have been developed. However sources of this type require a good vacuum environment to be long lived, and also generate a lot of heat, which can adversely affect the material being processed. For processes in which the substrate is temperature sensitive, a cold cathode is desirable. Several cold cathode electron sources have been devised. An electron beam system utilizing a large-area gas discharge source has been described by Rocca in U.S. Pat. No. 4,496,449. Another large-area electron exposure system (utilizing a cold cathode) is Hiroaka, U.S. Pat. No. 4,119,688 in which is described a pulsed glow discharge to illuminate a shadow mask. However, in pulsed glow discharges it is difficult to attain uniform exposure and precise dose control. Conventional glow discharge sources require a ballast resistor and are highly dependent on the vacuum operating pressure. Another large-area cathode, based on photoemission, is disclosed in U.S. Pat. No. 4,554,458, and utilizes an unpatterned photocathode to illuminate a shadow mask. However, photocathodes are easily poisoned and require an ultraclean high vacuum environment.

In conventional glow discharge processes the accelerating voltage and pressure are adjusted to control the discharge. One cannot achieve a large change in accelerating voltage without significantly altering the current or adjusting the pressure to keep the discharge stable, or both. If the target substrate outgasses, the pressure rises and the beam current rises uncontrollably. In U.S. Pat. No. 3,852,596, this problem is overcome by locating the cathode remotely from the target being irradiated and protecting the cathode by differential pumping the two enclosures. Differential pumping is achieved by physically separating the two volumes except for a small aperture through which the beam passes. The aperture is made small enough to limit the vacuum conductance such that a large pressure differential may be maintained between the two. This technique cannot be used for a large-area electron beam, which requires that the space between the cathode and target be open and relatively unimpeded.

In another prior art embodiment utilizing differential pumping to control a glow discharge electron source, Induni (Helv. Phys. Acta 20, 463, 1947) devised a means for producing a mostly monoenergetic electron beam. Induni separated the ionization and accelerating regions of a gas discharge electron source by enclosing the cathode in a tube with a small-aperture anode located close to the cathode. The small aperture anode is placed at a distance less than the mean free path of the electrons (which are accelerated toward the anode). Therefore no ionization takes place in the accelerating region. Electrons that pass through the anode aperture enter a larger chamber and create ions in this field free space. Those ions that happen to drift close enough to the small anode aperture are pulled into the accelerating field protruding through the aperture. The electron emission is controlled by adjusting the pressure in the field free space. Since a small aperture is used, the vacuum (pressure) levels can differ between the accelerating and ionization regions. This allowed a high vacuum to be maintained in the accelerating field region, thereby reducing the susceptibility of high voltage breakdown for high electron energy operation. Although Induni's electron gun solved many of the problems of a gas discharge electron source it produces a very small diameter and small angular beam which is not suitable for rapidly exposing large-area targets. Another disadvantage of this particular source is that to change the emission current requires a change in the pressure in the vacuum vessel (ionization region). To achieve a large change in emission current requires a large change in pressure. This is a serious drawback because it is very difficult to vary or control the pressure in a vacuum system rapidly and precisely. Another drawback of Induni's cathode is that it is designed to operate at a fixed accelerating voltage, whereas, in some processes, it is desirable to be able to vary continuously the accelerating voltage and consequently the energy of the electron beam incident on the target. In the Induni device this would not be possible without a large and precisely controlled change in pressure to maintain a constant emission current.

It will be appreciated from the foregoing that there is a significant need for an improved electron source that will overcome many of the disadvantages of the aforementioned earlier electron sources. In particular, what is needed is a broad area, uniform, cold, electron beam source with continuously variable voltage, capable of operation in a soft vacuum. Ideally, the electron source should also have a continuously variable accelerating voltage that can be utilized to rapidly process large-area substrates in semiconductor device fabrication for high resolution shadow mask lithography, photoresist curing or hardening, blanket exposure of resists for aiding lift-off processes, enhancing resist contrast or controlling resist pattern dimensions or pattern edge profiles. One object of this invention is to provide a continuously variable beam voltage from 1 to 30 KeV (thousand electron-volts) while maintaining the vacuum pressure within an easily controllable and narrow range.

Another object of the invention is to provide an improved cold cathode gas discharge source with a large emission area; for example, one to eight inches vide an electron source that can be controlled rapidly and accurately with an easily adjustable low bias voltage; for example, from 0 to 10 volts, to provide a device that is continuously variable in accelerating voltage without requiring large variations in operating vacuum level. It is a further object of the invention to provide a large-area cathode with substantially uniform emission over its entire surface and whose emitting surface does not contaminate, become poisoned, burn up, or oxidize, and is generally impervious to gas species that might be outgassed by the target being irradiated by the electron beam. Finally, it is also an object of the invention to provide a broad beam electron source which will operate in a continuous, rather than pulsed, emission mode, in a poor or soft vacuum environment and in close proximity to the target it is irradiating.

All of these objects are believed to be provided by the present invention, which is next described in summary form.

SUMMARY OF THE INVENTION

The present invention resides in a large-area electron source and a method for its operation. The electron source of the invention is capable of operation continuously, stably, and indefinitely in a poor vacuum environment. The electron source utilizes a glow discharge cathode with an intermediate grid anode between the cathode and a target to which the electrons are directed. The grid is positioned at a distance from the cathode less than the mean free path of electrons emitted by the cathode. Electron emission from the cathode can be controlled with a low voltage applied to the grid and the accelerating voltage on the cathode can be varied continuously from a few hundred volts to 30 Kv or greater. Further, the grid anode is of a fine mesh wire material of sufficiently small dimensions as to not be resolvable in the target plane. This provides an inexpensive, robust and uniform large-area electron beam source, which can be varied in voltage and current to treat various materials and coatings. A further refinement of the device utilizes scanning coils to achieve additional uniformity of the incident beam at the target plane.

Another embodiment utilizes a movable stage on which the target or substrate can be stepped beneath a beam shaping aperture. This in combination with an electronic integrator provides a simple and precise system for characterizing the sensitivity of materials to electron beam exposure. In yet another application of this robust electron beam source, it can be used as a curing tool for crosslinking and stabilizing photoresist. The system can also be used as an aid to liftoff processing in disrupting an underlaying film needing removal from the substrate.

It will be appreciated from the foregoing that the present invention represents a significant advance in glow discharge electron sources. In particular, the invention provides for the accurate and convenient control of the emission current independently of the accelerating voltage or the pressure. Further, the invention provides for the control of emission current more precisely and more uniformly at low emission currents, than any prior glow discharge electron device. Although biased grids have been used to control electron emission current in other contexts, the use of a biased grid positioned outside the ionization region, to control emission by controlling the flow of ions to the cathode, is believed to be completely novel.

Other aspects and advantages of the invention will become apparent from the following more detailed description, taken in conjunction with the accompanying drawings.

DESCRIPTION OF THE PREFERRED EMBODIMENTS

Figure 1:
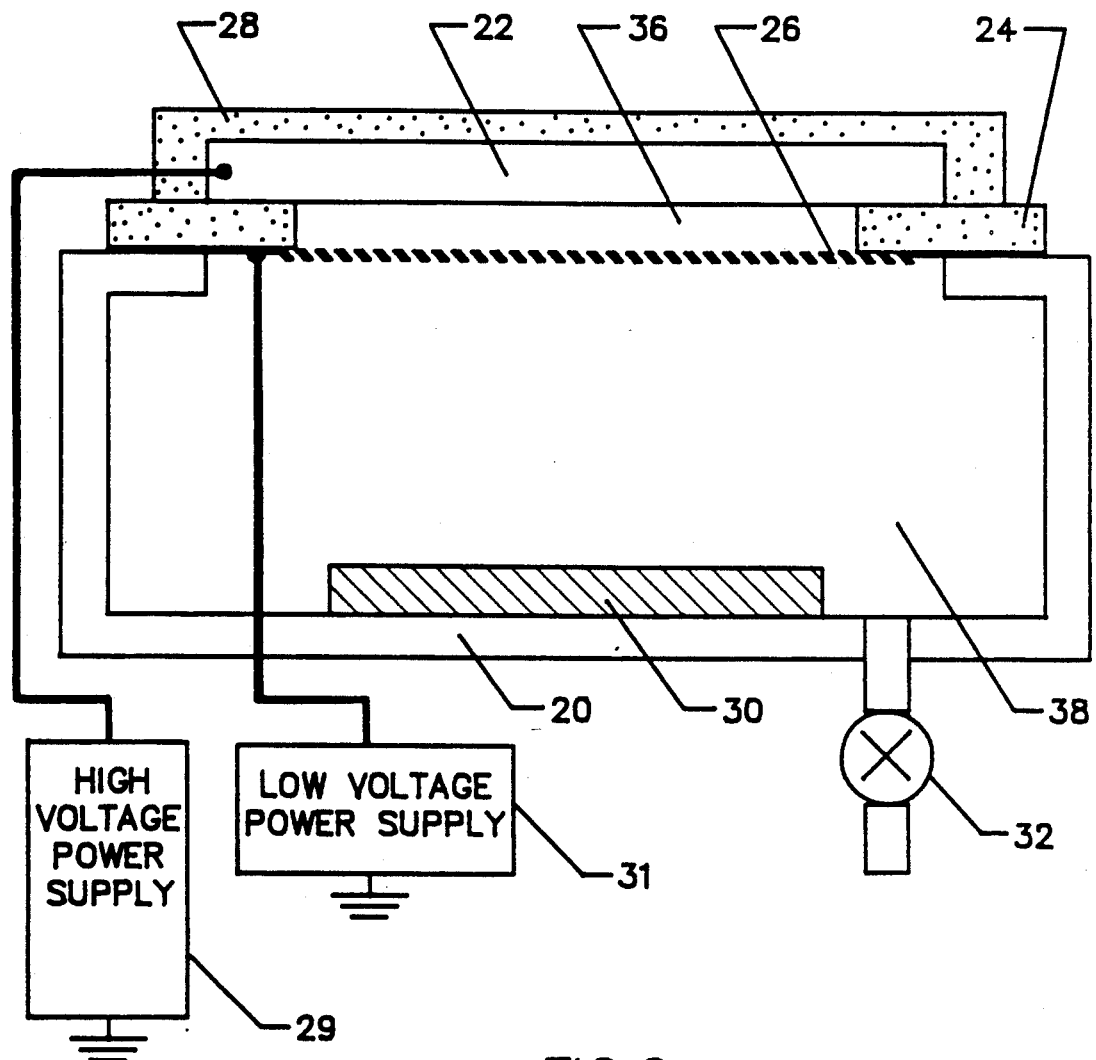
FIG. 1 is a simplified elevational view showing an electron beam exposure apparatus including the presently preferred embodiment of the new electron source

As shown in the drawings for purposes of illustration, the present invention is concerned with improvements in the field of electron sources utilized to expose, treat and process coatings and materials. Specifically, the invention pertains to a new cold cathode gas discharge electron source having a broad emitting area providing an electron beam that can be conveniently adjusted in voltage and current to treat various materials.

In accordance with the invention, a cold cathode gas discharge electron source includes a vacuum chamber, indicated by reference numeral 20, a large-area cathode 22, a target or substrate 30, located in a field-free region 38, and a grid (fine mesh screen) anode 26 placed between the target 30 and cathode 22, at a distance from the cathode that is less than the mean free path length of electrons emitted from the rent can be varied over a wide range by varying the bias voltage applied to the grid 26.

The apparatus of the invention further includes a high voltage insulator 24, which isolates the grid 26 from the large-area cathode 22, a cathode cover insulator 28 located outside the vacuum, a variable leak valve 32 for controlling the pressure inside the vacuum chamber 20, a variable high voltage power supply 29 connected to the cathode 22, and a variable low voltage 0 to 100 volt power supply 31 connected to the grid 26.

Figure 2:
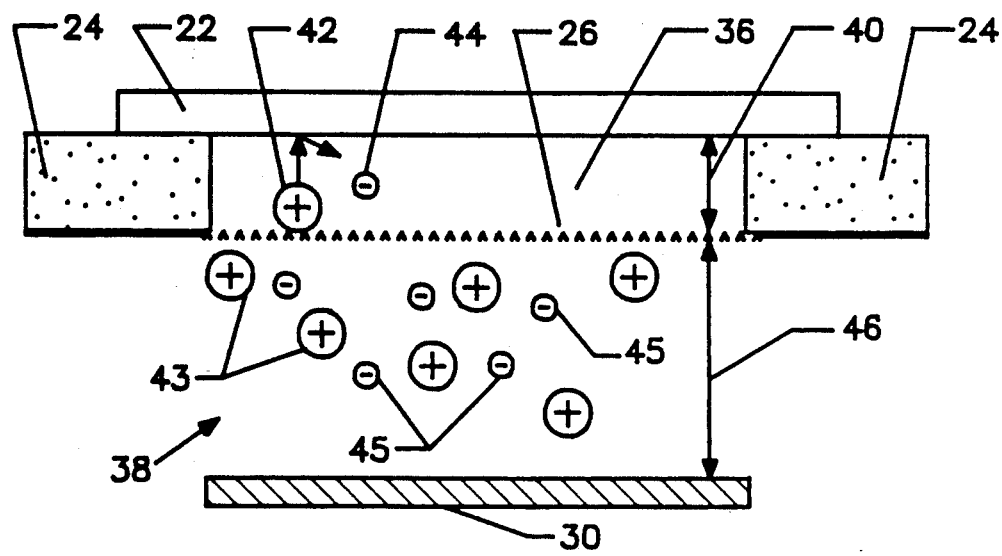
FIG. 2 is a fragmentary view similar to FIG. 1, but also showing schematically some of the details of operation.

In operation of the apparatus of the invention, the substrate to be exposed with the electron beam is placed on the target plane 30, and the vacuum chamber 20 is pumped from atmospheric pressure to a pressure in the range of 1 to 200 millibar. The exact pressure is controlled via the variable rate leak valve 32, which is capable of controlling pressure to $\pm/-1$ millibar. The high voltage (negative voltage between 500 volts and 30,000 volts or higher) at which the exposure is to take place is applied to the cathode 22 via the high voltage power supply 29. A variable voltage source 31 (for example: a d.c. power supply capable of sourcing or sinking current) is also applied to the grid anode 26. The voltage on the grid is utilized to control electron emission from the cathode, as will now be described with reference to FIG. 2.

To initiate electron emission, the gas in the space between the cathode 22 and the target 30 must become ionized. This transpires as a result of naturally occurring gamma rays, or emission can instead be initiated artificially inside the chamber by a high voltage spark gap. Once this initial ionization takes place, positive ions 43 are attracted to the grid 26 by a slightly negative voltage (0 to −80 volts) applied to the grid 26. These positive ions 42 pass into the accelerating field region 36 between the cathode 22 and the grid anode 26 and are accelerated towards the cathode surface 22 as a result of the high voltage applied to the cathode (−500 to −30,000 volts). Upon striking the cathode surface these high energy ions produce secondary electrons 44 which are accelerated back toward the grid 26. Some of these electrons, which are now traveling mostly perpendicular to the cathode surface, strike the grid (anode) structure 26 but many pass through the grid and continue on to the target 30. These high energy electrons ionize the gas molecules in the space between the grid 26 and the target 30.

The fine mesh grid 26 is placed at a distance less than the mean free path of the electrons emitted by the cathode. Therefore no significant ionization takes place in the accelerating field region 36 between the grid and the cathode. (In a conventional gas discharge device the electrons emitted would create further positive ions in the accelerating field region and all of these ions would be accelerated back to the cathode creating even more electron emission and the discharge could easily avalanche into an unstable high voltage breakdown.) However, in this invention, the ions 42 created outside the grid are controlled (repelled or attracted) by the voltage applied to the grid 26. Thus, the emission (electron beam current) can be continuously controlled (from very small currents to very large currents) by varying the voltage on the grid. Alternatively, the electron emission can be controlled by means of the variable leak valve 32, which can raise or lower the number of molecules in the ionization region between the target and cathode. However, due to the slow response time of adjusting the pressure in the chamber, it is more advantageous to adjust the pressure initially to produce some nominal emission current and then utilize the bias voltage on the grid 26 to rapidly and precisely control emission current.

The electron emission can be turned off entirely by applying a positive voltage to the grid 26, such that the positive grid voltage exceeds the energy of any of the positive ion species created in the space between the grid 26 and target 30. It has been found that the grid can be located a distance less than 4 mm from the cathode. This distance is less than the mean free path of electrons for the lowest voltage of interest (500 volts) and preferred operating vacuum pressure level. In the prior art practiced by Induni, he strived for a high vacuum in the accelerating field region to prevent breakdown.

Fortuitously, the preferred operating vacuum level of this invention is in the region of highest electrical dielectric strength. Therefore, even though the grid-to-cathode gap must by necessity be very small to be less than the mean free path determined by the lowest desired operating accelerating voltage, the system is operated at a vacuum level where the breakdown strength of the vacuum exceeds the field created by the highest operating voltage applied across the selected grid-to-cathode spacing. This low or soft vacuum level (20 to 80 millitorr) is easily achieved by inexpensive mechanical vacuum pumps and allows the cathode 22 and target 30 to be placed in close proximity to each other in the same vacuum environment.

Further, this mechanism of ion bombardment induced electron emission maintains a clean and uniform emitting cathode surface. Although this continual ion bombardment causes erosion of the cathode surface due to sputtering, by utilizing a low sputtering yield cathode material, such as aluminum, the cathode can be operated continuously for many thousands of hours without requiring replacement.

Figure 3:
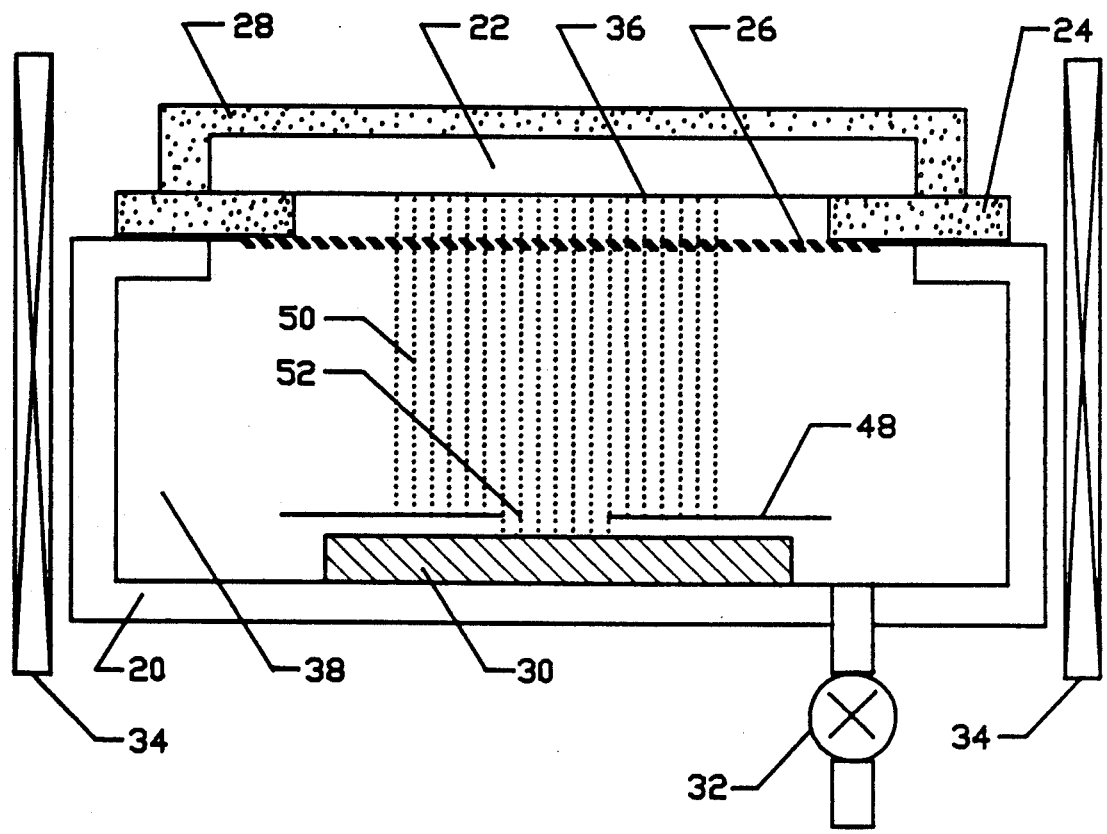
FIG. 3 is a view similar to FIG. 1, but also showing use of the invention in shadow mask lithography.

The electrons emitted from the cathode 22 are accelerated to the grid 26 and are mostly traveling perpendicular to the grid and cathode surface. Some emitted electrons are intercepted by the grid and some are scattered by the grid. If the target 30 is within a few millimeters of the grid, the electrons will cast an image of the grid on the target. However, if the target is placed at a large distance 46, such as 10 to 20 centimeters from the grid, the electron beam diffuses (due to initial transverse velocities and scattering) to a fairly uniform current density across the whole emitting area. The irradiation of the target can be made even more uniform by sweeping the beam back and forth across the target by means of a time-varying magnetic field produced by deflection coils 34 surrounding the exposure chamber, as shown in FIG. 3.

Another embodiment of the disclosed invention can be used for shadow mask lithography. An aperture plate or mask 48 is placed between the grid 26 and in contact or close proximity with the target 30, as shown in FIG. 3. Since the electrons moving toward the target 30 are nearly collimated by the accelerating field, as indicated at 50, and have relatively small transverse velocities, a shadow mask, such as the plate 48, placed in close proximity to the target will be accurately replicated by the electron beam 52 that is allowed to pass through the mask or aperture plate. In this way patterned lithography can be performed using the principle of the invention.

Figure 4:
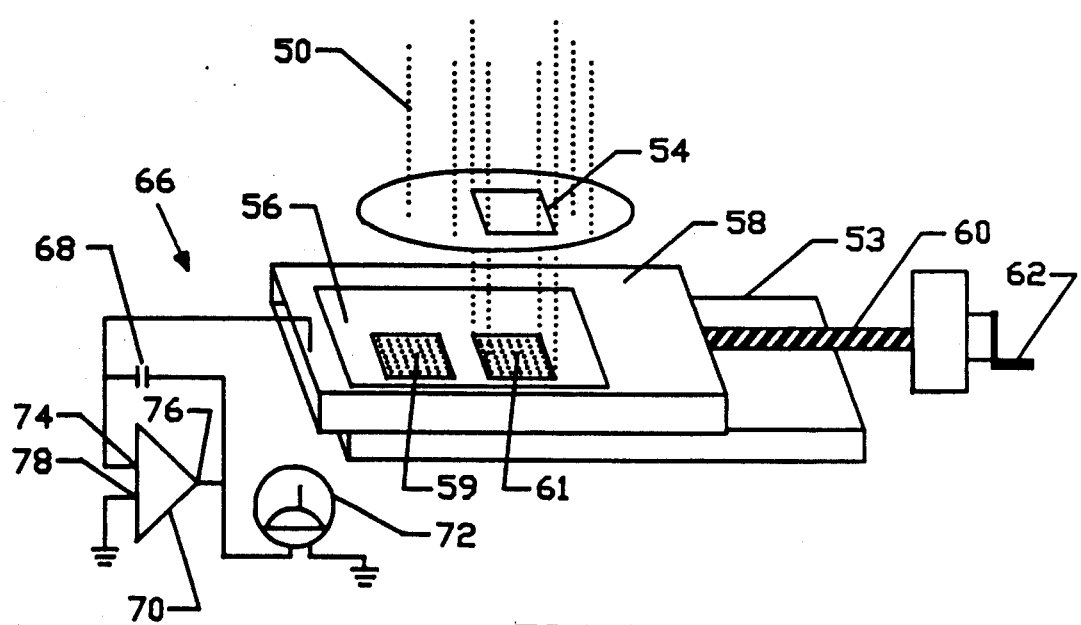
FIG. 4 is a schematic view of another embodiment of the invention, used as an exposure tool for determining resist sensitivity.

In yet another embodiment of the invention, used as a resist sensitivity tool as shown in FIG. 4, a shaped aperture 54 is placed between the grid and target. This aperture can form a small shaped electron beam having a uniform current density. The target material is then scanned or stepped under the beam to generate multiple patterns in an electron sensitive resist coated on the substrate or target. The electron beam passes through the shaped aperture 54 and impinges on a target substrate, indicated at 56 in FIG. 4, which is mounted on a movable slide 58. After exposing a square feature 59 of the substrate 56, the slide 58 is moved by means of a leadscrew drive 60 and crank 62. The crank motion is coupled into the vacuum system by a suitable rotary mechanical vacuum feedthrough (not shown). The substrate 56 is moved over enough to expose a new area of resist 61. Multiple exposures are made at different selected exposure doses and accelerating voltages. This technique has proved to be a very useful tool in evaluating the sensitivity of resist. By exposing a series of square patterns across a substrate, with each square having a slightly different level of exposure, resist sensitivity curves can be quickly established. Prior to the present invention, this could only be done with a very expensive electron beam lithography system. In this application, it is important to provide a very precise and uniform exposure in each feature exposed. It has been found by deflecting the beam above the aperture, utilizing magnetic deflection coils 34, that more uniform exposures can be achieved. The deflection coils scan different portions of the cathode emitting area over the pattern forming aperture, thereby averaging any nonuniformities in cathode emission. Since the aperture size is known, the exposure dose is determined with a simple electronic integrator 66, which measures the total integrated current reaching the substrate. The substrate is electrically connected to the integrator, which consists of a capacitor 68, operational amplifier 70, and voltmeter 72. The current collected by the substrate tends to charge the capacitor 68 through a feedback loop. The inverting input 74 of the operational amplifier 70 is a virtual ground referenced to the non-inverting input 78. The voltage at the amplifier output 76 is related to the dose by the expression $D=EC/A$, where D is the exposure dose in Coulombs per square centimeter, E is the voltage at the output 76, C is the capacitance in Farads of the capacitor 68, and A is the area in square centimeters of the aperture 54. The advantage of this method of dose control is that it measures actual dose in real time. In conventional electron beam lithography systems, the exposure dose is indirectly determined by the time of exposure and independent measurement of beam current before or after the actual exposure.

Another application of this invention is to resist curing. In semiconductor fabrication after pattern lithography has been performed, a resist layer must be hardened or cured prior to etching. Conventional practice utilizes baking of the resist to a high temperature. However, at these elevated temperatures the resist melts slightly and the pattern areas become distorted. Electron beam exposure of the resist provides a nonthermal means of crosslinking and hardening the resist. The substrate stays at room temperature yet the resulting exposed resist is fully crosslinked without pattern flow. With this invention, resist curing can be faster than ultraviolet curing or baking and results in a tougher resist film. In addition the electron beam can cure very thick resists, up to 20 micrometers at 30 KeV, which cannot be cured using ultraviolet curing systems. The ultraviolet radiation is absorbed in surface layers of the resist. Prior to this invention, electron beam curing of resist has not been widespread, due to the cost and time required by conventional electron beam lithography systems. With this new approach, using an inexpensive electron source as described, electron beam curing becomes a favorable alternative to baking or ultraviolet curing.

Another application of the disclosed invention is to provide an easily modulated electron beam source for lithography. In most electron beam lithography systems the electron beam is at high energy and is not easily turned on (unblanked) and off (blanked). To accomplish blanking in prior art systems the beam is deflected off an aperture in the electron optical column. However, there are drawbacks to this approach: the beam at the target plane moves while blanking occurs causing unwanted anomalies in the patterns being written. In addition the beam's continuous bombardment on the blanking aperture causes contamination and charging of the aperture deflecting the beam and causing errors in positioning of patterns being written. In practicing the present invention, it has been found that, at lower vacuum levels than practiced in prior art systems, electron emission has been achieved by biasing the anode aperture or grid 26, and further that a high energy beam >30 KeV can be turned on and off with just a few (1 to 5) volts variation on the grid. This small voltage on the exit aperture or grid anode has virtually no affect on the beam's landing position. This permits this electron source to be utilized in high resolution electron beam lithography and pattern generation as well as other applications requiring a modulated electron beam such as electron beam testing and inspection of integrated circuit devices.

Figure 5:
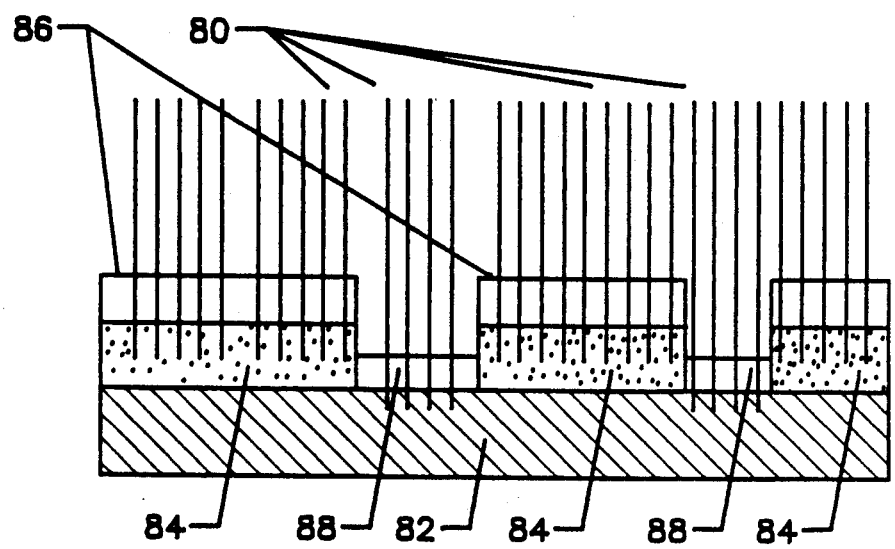
FIG. 5 is a schematic view showing use of the invention in a lift off process.

Another very useful application of the disclosed invention is as an aid in lift off processing as used in semiconductor fabrication. Lift off techniques in depositing patterned metal films have become quite widespread in semiconductor processing. As shown in FIG. 5, a substrate 82 to be patterned is coated with a photoresist 84, and exposed and developed using conventional photolithography. The metal to be deposited on the substrate is evaporated or sputtered on top of the resist film 84, as indicated at 86, and directly to the substrate 82 in developed windows in the resist, as indicated at 88.

At this point in the process, all that remains is to dissolve the resist remaining, i.e. in areas under the metal at 86, which will leave the metal film at areas 88, in the selected patterned areas only. However, this is the most difficult step in lift off processing, because the metal film covers the resist and keeps the solvent from dissolving the underlying resist. One proposed solution to this problem is to employ a high-power laser to disrupt the metal film over the resist. However, a better technique is to employ the new electron source of the present invention. By utilizing a broad area electron beam 80, it is possible to render the underlying resist 84 more soluble by exposing it with the electron beam at an appropriately high energy, such as 30 KeV. In addition to making the underlying resist more soluble, with large exposure doses (200 microCoulombs per square centimeter) the metal film 86 tends to blister, allowing a solvent to reach the underlying resist 84 in the subsequent dissolution process step. Although this technique may have been possible using conventional electron beam pattern generation systems, it was not practical because of the large exposure dose required over the entire substrate.

Figure 6:
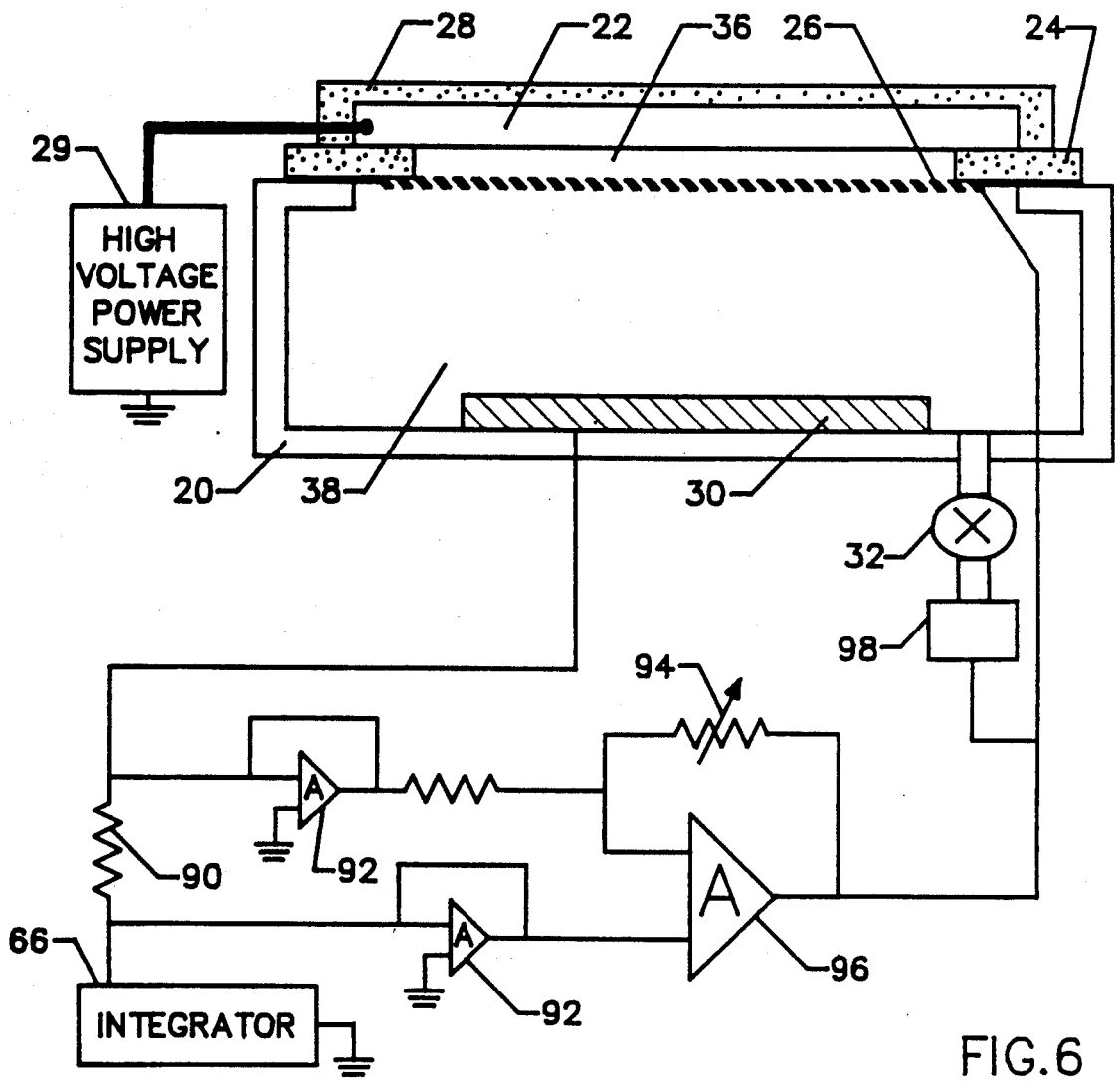
FIG. 6 is a view similar to FIG. 1, and showing the use of feedback to control beam current.

A further embodiment of this invention is shown in FIG. 6. In some applications it may be desirable to provide a constant beam current at different electron beam energies. For example it may be desirable to expose or cure the upper layer of resist on a resist coated substrate, but not the bottom layer. This can be done by utilizing an electron beam energy low enough such that most of the electrons are absorbed in the upper layer of the resist. Subsequent to curing the top layer, it may be desirable to cure the full thickness of the resist layer. This can be cone by raising the accelerating voltage of electron beam to penetrate completely through the resist layer to the substrate. It would be desirable in performing these exposures to be able to alter the accelerating voltage without causing a change in the emission current. However, if the accelerating voltage is increased it tends to cause more ionization and therefore an increase in beam current. Similarly if the accelerating voltage is lowered, ionization lessens and the beam current is decreased. A means of maintaining a constant beam current independent of changes in accelerating voltage is shown in FIG. 6. The beam current is sampled via a sense resistor 90, which is placed between the target and the integrator 66. (Alternatively, the beam current could be sampled at the grid as a portion of the beam is intercepted there.) Two unity gain voltage followers 92 buffer the signal obtained across the sense resistor 90 and feed it to an amplifier 96 with adjustable gain 94. The output of this amplifier controls the voltage on the grid anode 26, such that an increase in beam current will cause a decrease in bias voltage on the grid and decrease in emission current from the cathode 26. The gain of the amplifier 96 is adjusted, by means of the variable resistor 94, so that any change in current caused by a change in the accelerating voltage is counteracted by a change in bias voltage to maintain the beam current reaching the target constant. Alternatively, the output of the amplifier 96 can be connected to a voltage controlled variable rate leak valve 98, to counteract changes in emission current by raising or lowering the pressure in the ionization region 38. Further, a wider range of beam current control could be provided by utilizing feedback signals to both the variable leak valve 98 and the grid 26.

It will be appreciated from the foregoing that the present invention represents a vast improvement over other electron sources. In particular, the electron source of the invention provides a uniform, large-area beam of electrons at an easily controlled current level. Moreover, beam uniformity and beam current control are effective over a wide range of beam accelerating voltages, and under relatively poor vacuum conditions.

It will also be appreciated that, although various embodiments of the invention have been described in detail for purposes of illustration, various modifications may be made without departing from the spirit and scope of the invention. Accordingly, the invention is not to be limited except as by the appended claims.

I claim:

1. Electron emission apparatus, comprising:
   a vacuum chamber;
   a cathode, of which at least one surface of relatively large area is exposed to the vacuum in the chamber;
   means for applying a selected negative voltage to the cathode, to accelerate electrons toward a target also located in the vacuum chamber;
   a mesh grid anode spaced apart from the cathode at a distance not exceeding the mean free path length of electrons leaving the cathode for the lowest selected voltage applied between the cathode and grid anode; and
   means for applying a voltage to the grid anode;
   wherein the electrons accelerated from the cathode are emitted as a result of ions in the vacuum chamber being accelerated into the cathode, and wherein the distance between the grid anode and the target is great enough to ensure that ionization collisions occur in the region of the chamber between the grid anode and the target, to maintain an ion plasma in the region.

2. Electron emission apparatus as defined in claim 1, wherein:
   the mesh grid anode is of such small dimensions and the target is placed at such a large distance that the structure of the grid is not imaged on the target.

3. Electron emission apparatus as defined in claim 2, and further comprising:
   electromagnetic means for deflecting the electrons emitted from the cathode in a scanning pattern to reduce any imaging of the grid anode on the target.

4. Electron emission apparatus as defined in claim 1, and further comprising:
   means for controlling the pressure in the vacuum chamber, to further regulate the rate of electron emission from the cathode.

5. Electron emission apparatus as defined in claim 4, and further comprising:
   means for controlling the vacuum chamber pressure, to control the electron beam current based on measurement of the beam current.

6. Electron emission apparatus as defined in claim 1, and further comprising:
   means for varying the grid anode voltage, to control the electron beam current based on measurement of the beam current.

7. Electron emission apparatus as defined in claim 1, wherein:
   the means for applying a voltage to the grid anode includes means for applying a voltage that completely shuts off the electron beam by preventing positive ions from reaching the cathode.

8. Electron emission apparatus as defined in claim 1, and further comprising:
   an aperture plate mask positioned between the grid anode and the target, to produce a pattern of electron radiation on selected areas of the target.

9. A method for producing a controllable electron beam of relatively large cross-sectional area, the method comprising the steps of:
   applying a selected negative voltage to a large-area cathode positioned in a vacuum chamber, to accelerate electrons toward a target also located within the vacuum chamber;
   applying a voltage to a mesh grid anode spaced from the cathode by a distance not exceeding the mean free path length of electrons leaving the cathode for the lowest selected voltage applied between the cathode and the grid anode; and
   initializing ionization of residual gases in the vacuum chamber, whereby positive ions are attracted to the cathode surface and cause the emission of electrons from the cathode;
   maintaining an ion plasma in the vacuum chamber principally as a result of collisions between residual gas particles and electrons that have been accelerated through the mesh grid anode and toward the target, whereby a highly uniform electron beam is obtained; and
   controlling the rate of electron emission by varying the voltage applied to the grid, whereby a more negative grid anode voltage will attract more positive ions through the grid anode and into the cathode, to produce more electrons.

10. A method as defined in claim 9, and further comprising:
    deflecting the electron beam in a scanning pattern to reduce any imaging effect of the grid anode at the target.

11. A method as defined in claim 9, and further comprising:
    controlling the pressure in the vacuum chamber, to further regulate the rate of electron emission from the cathode.

12. A method as defined in claim 9, and further comprising:
    sensing the electron beam current; and
    controlling the current based on the sensed measurement of the current.

13. A method as defined in claim 9, and further comprising:
    curing a resist layer located at the target, with the electron beam from the cathode.

14. A method as defined in claim 9, and further comprising:

positioning an aperture plate mask between the grid anode and the target, to expose only selected areas of the target to the electron beam.

15. A method as defined in claim 14, and further comprising:

moving the plate perpendicular to the electron beam, to expose successive areas of the target to different exposure doses or accelerating voltages, for the purpose of measuring resist sensitivity.

16. A method as defined in claim 9, and further comprising:

applying a sufficiently positive voltage to the grid anode to completely shut off the electron beam.

17. A method as defined in claim 16, and further comprising:

alternately turning the electron beam off and on under control of the voltage applied to the grid anode, to provide a desired exposure pattern at the target.

18. A method as defined in claim 9, wherein:

the electron beam is employed to expose a metal layer prior to the use of a solvent in a lift off process.

19. Electron emission apparatus, comprising:

a vacuum chamber containing residual gas atoms;

a cathode, of which at least one surface of relatively large area is exposed to the vacuum in the chamber;

means for applying a selected negative voltage to the cathode, to accelerate a beam of electrons to a target also located in the vacuum chamber, from a region close to the cathode, wherein positive ions formed in an ionization region located between the cathode and the target are accelerated toward the cathode and induce the emission of electrons, some of which cause more ionization;

a mesh grid anode positioned between the cathode and the target but outside the ionization region, at a distance not exceeding the mean free path length of electrons leaving the cathode for the lowest selected voltage applied between the cathode and grid anode; and means for applying a voltage to the grid anode, to control the rate of electron emission from the cathode, whereby positive ions formed in the ionization region are selectively attracted or repelled by appropriately biasing the grid anode, and the electron beam current is controlled independently of pressure and electron accelerating voltage;

and wherein the distance between the grid anode and the target is great enough that an ion plasma is maintained in the ionization region principally by collisions between residual gas atoms and electrons that have been accelerated through the mesh grid anode, whereby a highly uniform beam current is obtained across the entire cathode surface and over a wide range of beam intensities.

20. Electron emission apparatus as defined in claim 19, wherein:

the means for applying a selected voltage between the cathode and the anode is capable of applying a voltage from as low as approximately 500 volts to at least as high as 30,000 volts.

* * * * *